United States Patent
Holtz et al.

(10) Patent No.: US 10,725,105 B2
(45) Date of Patent: Jul. 28, 2020

(54) CURRENT LEAKAGE AND CHARGE INJECTION MITIGATING SOLID STATE SWITCH

(71) Applicant: Keithley Instruments, LLC, Solon, OH (US)

(72) Inventors: Matthew Holtz, Solon, OH (US); James Niemann, Chagrin Falls, OH (US); Martin Rice, Sagamore Hills, OH (US)

(73) Assignee: Keithley Instruments, LLC, Solon, OH (US)

( * ) Notice: Subject to any disclaimer, the term of this patent is extended or adjusted under 35 U.S.C. 154(b) by 316 days.

(21) Appl. No.: 15/721,633

(22) Filed: Sep. 29, 2017

(65) Prior Publication Data

US 2019/0101591 A1    Apr. 4, 2019

(51) Int. Cl.
| | |
|---|---|
| *G01R 31/20* | (2006.01) |
| *G01R 31/319* | (2006.01) |
| *G01R 1/073* | (2006.01) |
| *G01R 31/28* | (2006.01) |
| *G01R 1/04* | (2006.01) |

(52) U.S. Cl.
CPC ..... *G01R 31/31924* (2013.01); *G01R 1/0483* (2013.01); *G01R 1/0735* (2013.01); *G01R 1/07385* (2013.01); *G01R 31/281* (2013.01); *G01R 31/2844* (2013.01); *G01R 31/2886* (2013.01); *G01R 31/2893* (2013.01); *G01R 31/31905* (2013.01); *H01L 2224/45144* (2013.01); *H01L 2924/00* (2013.01); *H01L 2924/00014* (2013.01); *H01L 2924/10253* (2013.01)

(58) Field of Classification Search
CPC ....... H01L 2924/00; H01L 2924/00014; H01L 2924/10253; H01L 2224/45144; G01R 31/2886; G01R 1/0483; G01R 31/2893; G01R 1/0735
USPC ......... 324/71, 378, 403, 415, 425, 500, 537, 324/754.01, 754.03, 754.12
See application file for complete search history.

(56) References Cited

U.S. PATENT DOCUMENTS

| | | | | |
|---|---|---|---|---|
| 2006/0071681 A1* | 4/2006 | Tanida | ............... | G01R 31/2844 324/762.01 |
| 2006/0208756 A1* | 9/2006 | Iwasaki | .............. | G01R 31/2889 324/754.1 |
| 2007/0008103 A1* | 1/2007 | Nicolls | .............. | G01R 31/3277 340/515 |
| 2013/0320959 A1* | 12/2013 | Mikata | ................... | G01R 25/00 324/76.77 |
| 2015/0171627 A1* | 6/2015 | Holtz | ..................... | H01H 9/542 361/56 |
| 2018/0321300 A1* | 11/2018 | Borthwick | ......... | G01R 31/2879 |

* cited by examiner

*Primary Examiner* — Raul J Rios Russo
(74) *Attorney, Agent, or Firm* — Miller Nash Graham & Dunn; Andrew J. Harrington

(57) ABSTRACT

Disclosed is a test and measurement switch matrix. The test and measurement switch matrix includes a solid state switch to couple a test signal from a Device Under Test (DUT) to a test system. The solid state switch has a dual tee guard arrangement providing low leakage when off. The solid state switch also includes an optically coupled drive, which further improves isolation and reduces undesirable charge injection when changing switch states.

20 Claims, 5 Drawing Sheets

CURRENT LEAKAGE AND CHARGE INJECTION MITIGATING SOLID STATE SWITCH

FIELD OF THE INVENTION

This disclosure is directed to mechanisms associated with aspects of a test and measurement system, and, more particularly, to mechanisms for solid state switching during signal testing.

BACKGROUND

Test and measurement systems are designed to receive and test signals, for example from a Device Under Test (DUT). In some automated test setups, sequences and/or combinations of DUT outputs are tested. In order to accomplish such testing, switching devices are employed to switch such outputs between the DUT and the test and measurement system. Such switching devices may employ mechanical relays. Such mechanical relays are small in size for a corresponding isolation voltage, which allows for the creation of a high-density switching device. However, mechanical relays also have many disadvantages for switching systems. First, such mechanical relays include an inherent limited switching lifetime before failure, which results in a limited lifetime for the switching device. Second, mechanical relays often take too long to switch. For example, reed relays require several milliseconds to change state, which can be problematic for quickly testing devices in a production test system. Third, mechanical relay contacts are susceptible to hot switching, which causes premature relay failure.

Examples in the disclosure address these and other issues.

BRIEF DESCRIPTION OF THE DRAWINGS

Aspects, features and advantages of embodiments of the present disclosure will become apparent from the following description of embodiments in reference to the appended drawings in which.

DETAILED DESCRIPTION

Figure 1:
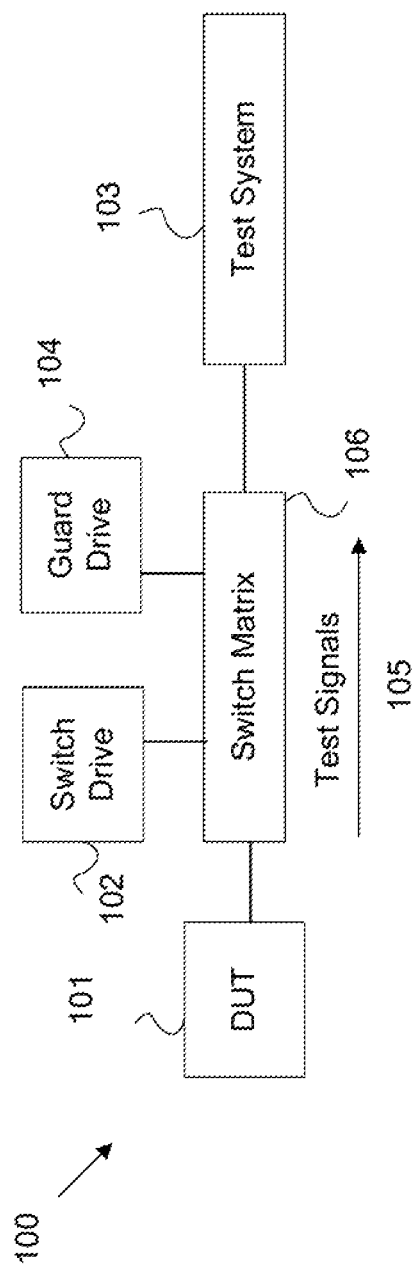
FIG. 1 is a schematic diagram of an example test network including a switch matrix, in accordance with various aspects of the present disclosure.

Solid state switches in a switching matrix provide a solution to some of the above disadvantages. For example, solid state switches have no lifetime switching limit. Further, solid state switches offer one to two orders of magnitude faster switching speeds than mechanical relays. Still further, solid state switches are less susceptible to hot switching damage. Unfortunately, solid state switches also add additional detriments in semiconductor test systems. First, solid state switches selected for high voltage applications have high leakage current when in the off state. Such leakage currents alter test results when making low current measurements for a high voltage DUT. Second, for a specified size, solid state switches have poor voltage isolation when in the off state as compared to mechanical relays. Third, solid state switches selected for high isolation voltage also include high series resistance when in the on state, which negatively impact high current measurements for the DUT. Fourth, solid state switches exhibit charge injection when changing states. Such charge injection results in switch matrix current becoming injected into a test signal current, which can negatively impact measurements at the test and measurement system.

Disclosed herein is a solid state switching mechanism that can be employed in a switching matrix while addressing the abovementioned disadvantages. A solid state switching network is employed. The solid state switching network is arranged in a double tee arrangement, which allows voltage guarding to mitigate current leakage. For example, a solid state switch is positioned between an input guard switch and an output guard switch. When the solid state switch is in the off state, a guard voltage is coupled between the input guard switch and the solid state switch. The solid state switch employs devices with low resistance in the on state and high voltage isolation, which would normally result in high current leakage. The input guard switch and the output guard switch employ devices with low voltage isolation, low resistance in the on state, and low current leakage in the off state. The result of such a configuration is that the guard drives any leakage current across the solid state switch, preventing such current from affecting the DUT or instruments in the test system. Further, the embodiment can also maintain a low on-state resistance without sacrificing high voltage isolation. The embodiment mitigates charge injection and voltage isolation size constraints by using an optical isolation mechanism. Charge injection occurs due to capacitance between a solid state switch's gate and source and/or between the solid state switch's gate and drain, depending on switch state. In a switching system with a ground referenced drive circuit, most of the charge injected by such capacitance is injected into a pathway through the DUT. This may cause damage to the DUT in some cases. To combat this issue, an optical isolator is coupled to the gate of each switch, with solar cells coupled to the source of each switch. This arrangement causes the majority of the injected charge to return to the optical isolator instead of being channeled through the DUT. While some charge may still be injected into the DUT via the switch drain, such current is minimal because the gate to drain capacitance is small compared to the gate to source capacitance. Finally, safety related voltage isolation spacing requirements between conductive elements rise as the voltage across a solid state switch increases. By employing an optical isolator, which allows for isolation through air, safety based size requirements are significantly reduced leading to a smaller switch while maintaining high voltage isolation.

FIG. 1 is a schematic diagram of an example test network 100 including a switch matrix 106. The switch matrix 106 is configured to switch test signals 105 from a DUT to a test system 103. The switch matrix 106 is controlled by a switch drive 102 and a guard drive 104, which may also be referred to as a tee drive.

The DUT 101 is any signal source configured to conduct electrical signals, such as a test signal 105. The DUT 101 may be any device or group of devices that a user desires to test in order to determine relevant electrical characteristics. For example, the DUT 101 may include semiconductor device(s) containing conductive circuitry that includes a plurality of test points that generate the test signals 105. The test signals 105 may be any electrical signal(s) generated by the DUT 101 and forwarded to the test system 103 for testing. The DUT 101 is coupled to the switch matrix 106 via one or more ports. The DUT 101 may also alternate the test signals 105 sent in a predetermined sequence and/or in predetermined combinations.

The switch matrix 106 includes a plurality of solid state switches as discussed below. The switch matrix 106 is configured to switch one or more test signals 105 toward the test system 103. The switch matrix 106 is controlled by the switch drive 102 and the guard drive 104. Though depicted separately, the switch drive 102 and the guard drive 104 may be included in a single device in some examples. The switch drive 102 is a programmable component configured to operate the solid state switches in the switch matrix 106 in a predetermined pattern to forward the test signals 105 to the test system 103 in the desired combinations and/or sequences for proper testing. The guard drive 104 (e.g. tee drive) is programmable to operate guard circuits in order to mitigate current leakage from the test signal 106 across the solid state switches. The switch drive 102 and the guard drive 104 may each contain processors, memory, network ports, and/or input output (I/O) ports. The ports communicate commands for use in programming the memory with instructions that, when executed by the processor(s), cause the switch drive 102 and the guard drive 104 to operate the switch matrix 106.

The test system 103 may be any system configured to test the electrical characteristics of the DUT 101 by measuring test signals 106. For example, test system 103 may include an oscilloscope, a parameter analyzer, parametric curve tracer, parametric test system, etc. The test system 103 may be employed to program the guard drive 104 and switch drive 102 in some examples. The test system 103 may include one or more processors, memory, I/O ports, network ports, a display, etc. The test system 103 measures the test signals 106, stores the results in memory, and/or displays such results to a user as desired.

Figure 2:
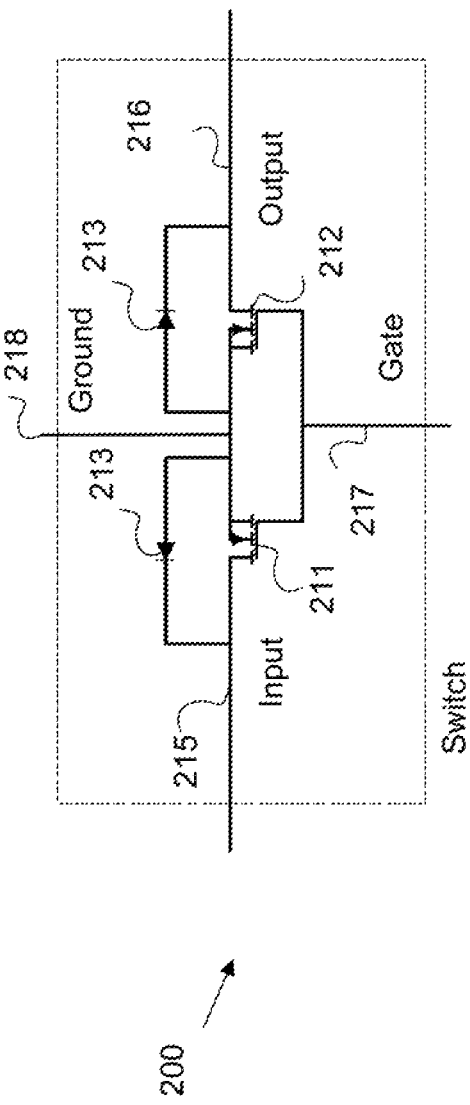
FIG. 2 is a schematic diagram of an example solid state switch, in accordance with various aspects of the present disclosure.

FIG. 2 is a schematic diagram of an example solid state switch 200, which may be employed in a switch matrix, such as switch matrix 106. Solid state switch 200 is depicted as a Metal Oxide Semiconductor Field Effect Transistor (MOSFET) based switch, but may also be built according to any other solid state switch type discussed herein.

The solid state switch 200 includes an input 215 for receiving a test signal, such as a test signal 106. For purposes of clarity, the input 215 may be referred to as switch_in in some cases to distinguish from inputs of other components. The solid state switch 200 also includes an output 216 for outputting the test signal when the solid state switch 200 is in an on state and outputting approximately zero current when the solid state switch 200 is in an off state. For purposes of clarity, the output 216 may be referred to as switch_out in some cases to distinguish from outputs of other components. The solid state switch 200 also includes a gate 217, which is operable to change the state of the solid state switch 200 from off to on, and vice versa. The solid state switch 200 also includes a ground 218 coupled between transistor 211 and transistor 212. In the MOSFET example depicted in solid state switch 200, a voltage on the gate 217 relative to ground 218 changes the switch 200 state.

The solid state switch 200 includes transistors 211 and 212, which may be MOSFETs. The transistors 211 and 212 each include a source (e.g. input), a drain (e.g. output), and a gate. Applying a voltage to gate 217 relative to a ground 218 causes the solid state switch 200 to enter the on state by turning on the transistors 211 and 212. When in the on state, the solid state switch 200 conducts from the input 215 to the output 216. When the voltage is removed from gate 217, the solid state switch 200 to enters the off state by opening the transistors 211 and 212. When in the off state, the solid state switch 200 stops conducting in an ideal case. The solid state switch 200 includes body diodes 213. The body diodes 213 allow current to flow from the source to drain of transistor 211 and from the source to the drain of transistor 212. The body diodes 213 may be intrinsic to the corresponding transistors.

Solid state switch 200 exhibits certain undesirable characteristics when employed for switching. For example, the solid state switch 200, when employed in a switching matrix, is selected to maintain voltage isolation in high voltage systems. For example, the solid state switch 200 may be required to withstand over one thousand volts (V) during normal operation. As such, transistors 211 and 212 may be each be required to withstand high voltage levels. Due to factors relating to MOSFET construction, transistors that withstand high voltage, such as transistors 211 and 212, have either low off state current leakage and high on state channel resistance, or high off state current leakage and low on state channel resistance. As discussed below, solid state switch 200 should be selected to have low on state channel resistance for proper measurement by a test system. Hence additional circuitry should be employed to mitigate the high current leakage inherent in such a transistor selection.

Figure 3:
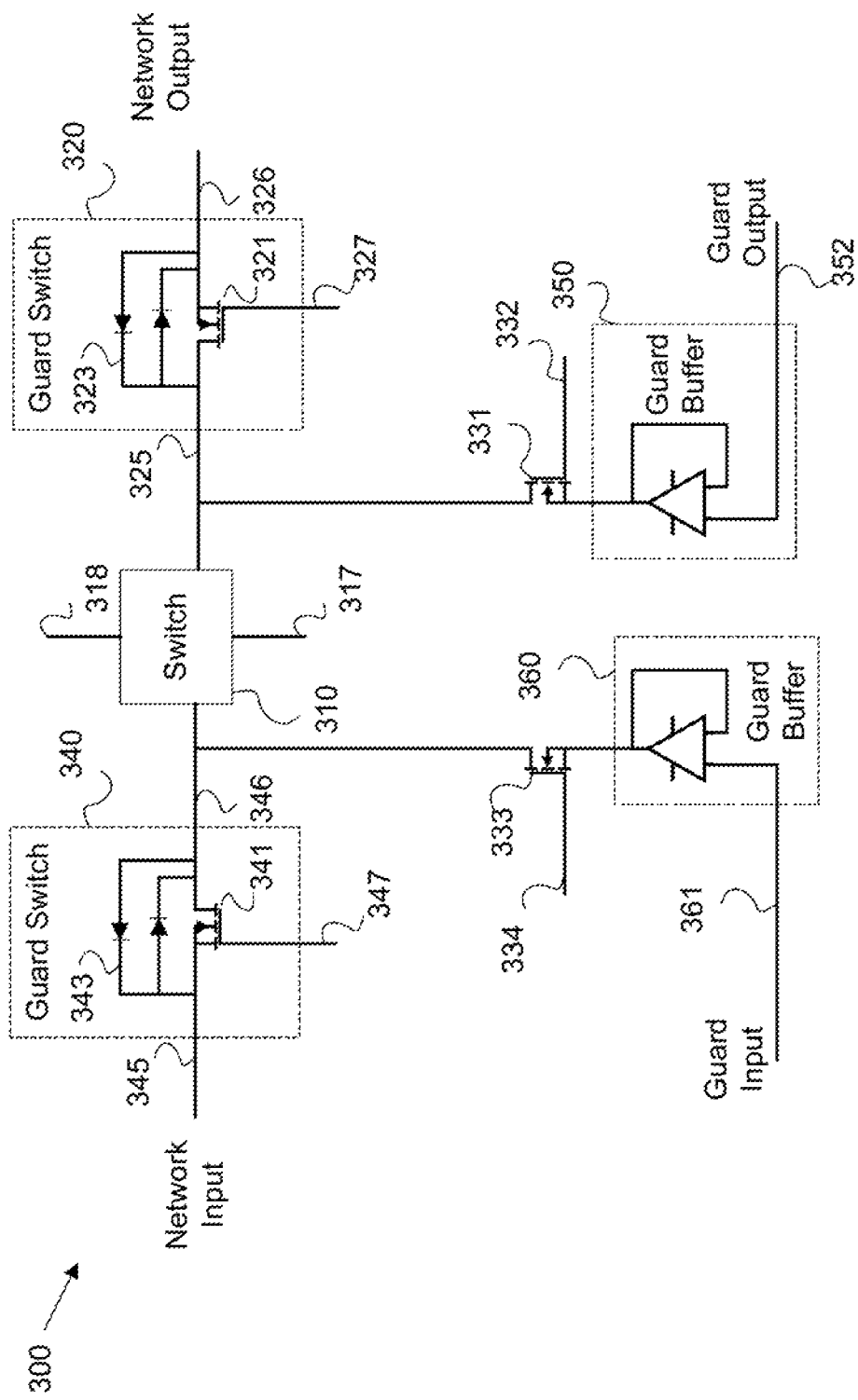
FIG. 3 is a schematic diagram of an example solid state switching network with a guard mechanism, in accordance with various aspects of the present disclosure.

FIG. 3 is a schematic diagram of an example solid state switching network 300 with a guard mechanism, which mitigates current leakage by a solid state switch such as solid state switch 200. The solid state switching network 300 is implemented in a test and measurement switch matrix, such as switch matrix 106. It should be noted that components on an input side of solid state switch 310 are labeled as input components and components on the output side of the solid state switch are labeled as output components. Such labeling is for clarity, and does not imply that input components are different from output components unless otherwise stated.

The network 300 includes a signal channel to couple a test signal from a DUT to a test system. The signal channel includes a solid state switch 310, an input guard switch 340, and an output guard switch 320. The solid state switch 310 may be substantially similar to the solid state switch 200. As shown above, the transistors in a solid state switch 310 may each contain a source and a drain. The solid state switch 310 may also contain a gate 317 and a ground 318, which is substantially similar to gate 217 and ground 218, respectively. The gate 317 is controlled by a switch drive, such as switch drive 102. The solid state switch 310 is selected to have high voltage isolation, low on state resistance, and high leakage current. While solid state switch 310 may be configured as a MOSFET switch as depicted in FIG. 2, the solid state switch may also be configured as a Bipolar Junction Transistor (BJT) switch, an insulated-gate bipolar transistor (IGBT) switch, a Photoelectric Metal Oxide Semiconductor (photomos) transistor switch, and/or any other solid state switch.

When off, the solid state switch 310 provides high voltage isolation (e.g. in excess of 1000 V) but is also subject to significant leakage current. Accordingly the network 300 includes an input guard switch 340 and an output guard switch 320. The function of these switches is to reduce leakage when the switch is off. This happens because the input guard switch 340 and the output guard switch 320 are not subjected to significant voltage across their terminals (e.g. a few millivolts or less), since guard is nearly the same voltage as the signal itself. The input guard switch 340 and the output guard switch 320 are selected to have low on state resistance. Further, the solid state switch 310 exhibits higher voltage isolation when off than the input guard switch 340 and the output guard switch 320. As the input guard switch 340, the solid state switch 310, and the output guard switch 320 all contain low resistance when on, the entire signal channel through the network 300 also contains low resistance when on.

The input guard switch 340 is coupled to the input of the solid state switch 310. Specifically, the input guard switch 340 includes a transistor 341 with a source 345 connected to the network input, a drain 346 connected to the input of the solid state switch 310 and a gate 347. The transistor 341 is depicted as a MOSFET, but may include any solid state switch. The gate 347 is controlled by a guard drive, such as guard drive 104. The input guard switch 340 also includes anti-parallel diodes 343. The anti-parallel diodes 343 allow current to pass between the source 345 and drain 346, and vice versa, during state changes (e.g. switching). This equalizes voltage and ensure the input guard switch 340 does not experience a high voltage load. The anti-parallel diodes 343 limit the maximum voltage applied to the corresponding transistors, and hence allow the transistor employed for the input guard switch 340 to be selected as a physically small, low voltage component. In operation, the input guard switch 340 are closed (e.g. by the guard drive) to provide a test signal to the solid state switch 310 when the solid state switch 310 is in the on state. The input guard switch 340 also open to remove the test signal from the solid state switch 310 and apply an input guard voltage to the solid state switch 310 when the solid state switch 310 is in the off state.

The output guard switch 320 is coupled to the output of the solid state switch 310. Specifically, the output guard switch 320 includes a drain 325 coupled to the output of the solid state switch 310. The output guard switch 320 also includes a source 326 coupled to the network output. The output guard switch 320 further includes a gate 327 which are controlled by a guard drive in a manner similar to the input guard switch 340. The output guard switch 320 includes a transistor 321 coupled to the source 326, gate 327, and drain 325. The output guard switch 320 also include anti-parallel diodes 323. The transistor 321 and anti-parallel diodes 323 may be substantially similar to transistor 341 and anti-parallel diodes 341, respectively.

The network 300 also includes a guard circuit. The guard circuit provides a guard voltage to the solid state switch 310 when the solid state switch is in the off state. As noted above, the solid state switch 310 induces undesirable current leakage when off. The guard circuit allows the solid state switch 310 to draw leakage current from the guard circuit instead of from the signal channel. Accordingly, the guard circuit mitigates the impact of the current leakage of the solid state switch 310 on the test signal traversing the signal channel. The guard circuit includes an input guard buffer 360, an input buffer switch 333, an output guard buffer 350, and an output buffer switch 331. The guard circuit is bounded by the input guard switch 340 and output guard switch 320. As shown, the guard circuit creates a double tee shape and may be referred to as a tee circuit. Hence, the guard drive that operates the guard circuit may also be referred to as a tee drive.

The input guard buffer 360 is coupled to the drain 346 of the input guard switch 340 and the input of the solid state switch 310 via the input buffer switch 333. The input guard buffer 360 receives a guard input voltage via a guard input 361 and applies this voltage to the solid state switch 310 when the solid state switch is in an off state. In some examples, the guard input voltage is a copy of the voltage received at the network input 345. The input guard buffer 360 may include an amplifier, such as an operational amplifier (opamp). The input guard buffer 360 produces a guard signal the same voltage as the guard input 361 and acts as a source from which the leakage current of solid state switch 310 may draw current when the solid state switch 310 is off. The input buffer switch 333 may be a transistor, and is employed to switch the guard input voltage from the guard buffer 360 to the solid state switch 310 when the solid state switch is off and withhold the guard input voltage from the solid state switch 310 when the solid state switch 310 is on. This prevents the guard buffer 360 from affecting the test signal in the signal channel when the solid state switch 310 is on. The input buffer switch 333 includes a gate 334, which is controlled by a guard drive.

The output guard buffer 350 is coupled to the drain 325 of the output guard switch 320 and the output of the solid state switch 310 via the output buffer switch 331. When the solid state switch 310 is in the off state, the output guard buffer 350 provides a voltage to the output of the solid state switch 310 through output buffer switch 331 in order to mitigate the effect of current leakage through solid state switch 310 as well as the output guard switch 320. The output guard buffer 350 may include an amplifier, such as an opamp. The output guard buffer 350 may be substantially similar to the input guard buffer 360, but is arranged to buffer the output signal rather than the input signal. The output buffer switch 331 connects the path to the output guard buffer 350 when the solid state switch 310 is in the off state. Further, the output buffer switch 331 disconnects the path to the output guard buffer 350 when the solid state switch 310 is in the on state. When the solid state switch 310 is off, the guard circuit channels any leakage current through solid state switch 310 to the guard buffer output 350. The output buffer switch 331 opens to prevent the test signal in the signal channel from being affected by the guard voltage when the solid state switch 310 is on. Further, because the voltage across output guard switch 320 is nearly identical to the voltage across the input guard switch 340, there is very little leakage through the output guard switch 320, reducing the effect on the DUT. The output buffer switch 331 includes a gate 332, which is controlled by the guard drive. It should be noted that the input guard buffer 360 and the output guard buffer 350 are optional components in the guard circuit. The guard buffers prevent test signal leakage even when a guard input 361 and/or a guard output 352 is disconnected. Further, when the network 300 is employed in conjunction with a source-measure unit (SMU) as the test system, the guard buffers improve SMU output stability by driving an output cable and DUT capacitances. In some examples, the guard input 361 and guard output 352 are connected by an additional switch and the guard buffers 350 and 360 are omitted.

The overall switching operation of network 300 is now described. For purposes of discussion, the network 300 is initially be in the on state with the input guard switch 340, the solid state switch 310 and the output guard switch 320 all in the on state and coupling a test signal across the signal channel between the network input 345 and the network output. A drive system determines to disconnect the test signal by transitioning network 300 into an off state. It should be noted that the input guard switch 340 and the output guard switch 320 may be damaged by so called hot switching, which occurs when solid state devices exceed their safe operating voltage during a switch state change. Accordingly, a switch drive switches the solid state switch 310 into an off state first so that the input guard switch 340 and the output guard switch 320 do not experience hot switching. A guard drive then signals the input guard switch 340 and the output guard switch 320 to turn off. The guard drive also signals the input buffer switch 333 and the output buffer switch 331 to turn on (e.g. the logical inverse of the guard switches). This disconnects the test signal from the solid state switch 310 and connects the guard signal to the solid state switch 310, respectively. It should be noted that preventing the input guard switch 340, the output guard switch 320, the input buffer switch 333, and the output buffer switch 331 from hot switching relaxes device selection requirements for the network 300. Hence smaller size components may be employed for these transistors, which in turn reduces the size requirements of the network 300.

Switching the network 300 back into the on state is accomplished in the opposite order of switching the network to the off state. The guard drive first switches the input guard switch 340 and output guard switch 320 on and the input buffer switch 333 and the output buffer switch 331 off, respectively. The switch drive then switches the solid state switch 310 to the on state, which prevents hot switching by components other than the solid state switch 310. By employing the abovementioned approach, the network 300 mitigates problems related to hot switching. The network 300 also provides low on state resistance and high voltage isolation. Further, the network 300 drains off current leakage by employing the guard circuit, and hence mitigates the effect of leakage current on the test signal.

Figure 4:
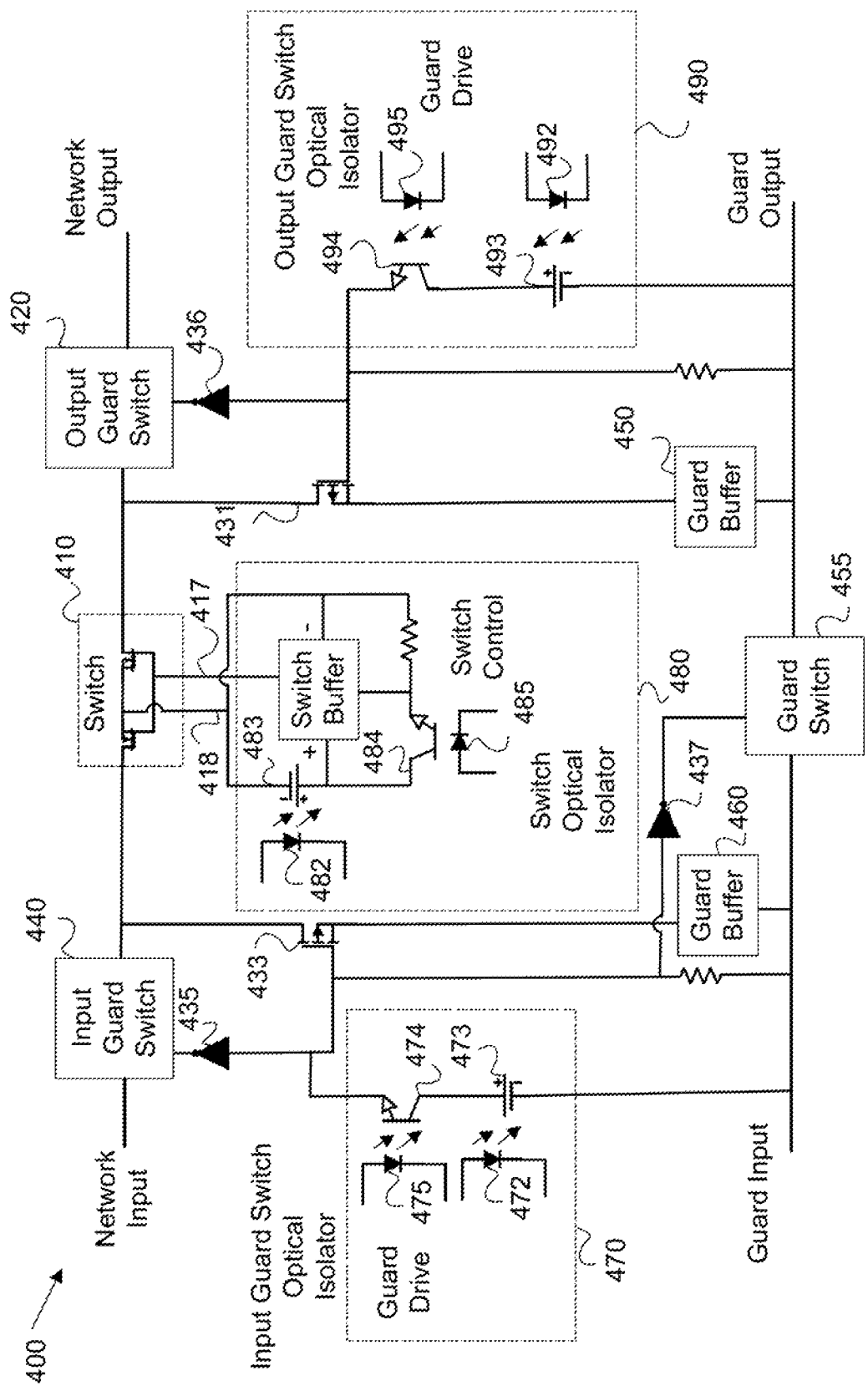
FIG. 4 is a schematic diagram of an example solid state switching network with a guard mechanism and optical isolation, in accordance with various aspects of the present disclosure.

FIG. 4 is a schematic diagram of an example solid state switching network 400 with a guard mechanism and optical isolation. Network 400 is substantially similar to network 300, but also contains optical isolation components. The optical isolation components isolate the network 400 switching components from the corresponding drive systems. There are multiple advantages to physically isolating switching circuitry from drive circuitry. Such isolation mitigates the possibility of breakdown from high voltage switch nodes to low voltage drive circuitry across the surface of a printed circuit board. Further, isolation reduces the capacitance between the drive circuit and the network 400 switches. This in turn mitigates off state leakage and charge injection by floating gate drive signals (e.g. isolating the drive signals from earth ground). Low charge injection is desirable as charge injection causes current to flow through the DUT when the switch changes state, which can cause measurement problems.

The network 400 includes a signal channel with an input guard switch 440, a solid state switch 410, and an output guard switch 420, which may be substantially similar to the input guard switch 340, the solid state switch 310, and the output guard switch 320, respectively. The network 400 also includes a guard circuit with an input guard buffer 460, an input buffer switch 433, an output buffer switch 431, and an output guard buffer 450, which may be substantially similar to the input guard buffer 360, the input buffer switch 333, the output buffer switch 331, and the output guard buffer 350, respectively. The network 400 also includes a plurality of optical isolators coupled to the gate of the solid state switch 410, the gate of the input guard switch 440, and the gate of the output guard switch 420, respectively. The optical isolators mitigate charge injection related to gate capacitance by ensuring the local floating ground of the switching circuitry is not directly connected to the ground coupled to the DUT. The guard circuit further includes a guard switch 455 which switches the guard signal from input to output.

Specifically, the network 400 includes an input guard switch optical isolator 470 coupled to the gate of the input guard switch 440, via an inverter 435, and the gate of the input buffer switch 433. The input guard switch optical isolator 470 includes an optical transmitter 472, such as an LED. The optical transmitter 472 provides light across an isolation barrier, such as an air gap, which may be about ten centimeters (cm) in some examples. On the other side of the isolation barrier, the input guard switch optical isolator 470 includes a photovoltaic cell 473. The photovoltaic cell 473 is any cell capable of converting optical energy to electrical energy. Accordingly, the photovoltaic cell 473 powers the circuitry that switches the guard switch 440 and the input buffer switch 433. Further, the input guard switch optical isolator 470 includes an optical transmitter 475 (e.g. an LED) coupled to a guard drive. The optical transmitter 475 also provides light across an isolation barrier, such as an air gap. Unlike the optical transmitter 472 which provides power, the optical transmitter 475 provides an optical signal based on the signal from the guard drive circuit. The input guard switch optical isolator 470 also includes an optical receptor 474 positioned across the isolation barrier from the optical transmitter 475 (e.g. separated by an air gap). The optical receptor 474 is coupled to the gate of the input guard switch 440, via a first inverter 435, and coupled to the input buffer switch 433. As such, the first inverter 435 couples the gate of the input guard switch 440 to the input guard switch optical isolator 470. In operation, the optical receptor 474 receives the guard signal from the guard drive via the optical transmitter 475 over the isolation barrier. The optical receptor 474 allows current to flow from the photovoltaic cell 473 based on the received guard signal, resulting in a floating guard signal across the isolation barrier. A logically inverted guard signal is then forwarded to the input guard switch 440 and the guard signal is forwarded to the input buffer switch 433.

The guard signal is also forwarded to the guard switch 455 via a third inverter 437. The guard switch 455 receives a guard input that mirrors the network input in the signal channel. When the signal channel is connected, the guard switch 455 is closed, which allows the guard input to flow directly to the guard output without being forwarded toward the signal channel. When the guard signal from the optical receptor 474 indicates that the guard circuit is to be engaged, the guard switch 455 disconnects, which forwards the guard input toward the solid state switch 410 via the input buffer switch 433. As the guard input mirrors the network input, only minimal current leaks across the input guard switch 440, if any. Hence any current leakage across the solid state switch 410 comes from the guard input, and not the network input.

The network 400 also includes an output guard switch optical isolator 490, which may be substantially similar to the input guard switch optical isolator 470. The output guard switch optical isolator 490 includes an optical transmitter 492, such as an LED, which charges a photovoltaic cell 493 across an isolation barrier as discussed above. The output guard switch optical isolator 490 also includes an optical transmitter 495 (e.g. an LED) coupled to the guard drive. The output guard switch optical isolator 490 further includes an optical receptor 494. The optical transmitter 495 and the optical receptor 494 of the output guard switch optical isolator 490 are also separated by an isolation barrier such as an air gap. The optical receptor 494 is coupled to the gate of the output guard switch 420 via a second inverter 436. The optical receptor 494 is also coupled to the output buffer switch 431. The inverter 436 couples to the gate of output guard switch 420 to the output guard switch optical isolator 490. As with the input guard switch optical isolator 470, the optical receptor 494 receives the guard signal from the guard drive via the optical transmitter 495 over the isolation barrier. The optical receptor 494 then allows current to flow from the photovoltaic cell 493 based on the received guard signal, resulting in a floating guard signal across the isolation barrier. A logically inverted guard signal is then forwarded to the output guard switch 420 and the guard signal is forwarded to the output buffer switch 431. This opens a path for the guard input to traverse the solid state switch 410 toward the guard output when the guard circuit is engaged and closes such a path when the guard circuit is disengaged.

The network 400 also includes a switch optical isolator 480, which may be substantially similar to the input guard switch optical isolator 470 and the output guard switch optical isolator 490, but is connected to the switch drive instead of the guard drive. The switch optical isolator 480 includes an optical transmitter 482, such as an LED, which powers a photovoltaic cell 483 across an isolation barrier as discussed above. The switch optical isolator 480 also includes an optical transmitter 485 (e.g. an LED) coupled to a switch drive. The switch optical isolator 480 further includes an optical receptor 484. The optical transmitter 485 and the optical receptor 484 of the switch optical isolator 480 are also separated by an isolation barrier such as an air gap. The optical receptor 484 is coupled to the gate 417 of the solid state switch 410, for example via another buffer. As with the other optical isolators, the optical receptor 484 receives a switch signal from the switch drive via the optical transmitter 485 over the isolation barrier. The optical receptor 484 then allows current to flow from the photovoltaic cell 483 based on the received switch signal, resulting in a floating switch signal across the isolation barrier. The switch signal is then forwarded to the solid state switch 410. Further, a ground 418 of the solid state switch 410 is coupled to the negative terminal of the photovoltaic cell 483 and the optical receptor 484. As noted above, gate capacitance of the transistors in the solid state switch 410 may cause charge injection. The ground 418 provides a path for such charge to be returned to the photovoltaic cell 483 and captured on the capacitor instead of being injected into the signal channel at the solid state switch 410.

As shown, the network 400 controls the solid state switch 410 via a switching signal from a switch drive. The switching signal is communicated over an air gap in the switch optical isolator via light pulses to maintain electrical isolation between the switch matrix and the switch drive. Further, the input guard switch 440, the output guard switch 420, the input buffer switch 433, the output buffer switch 431, and the guard switch 455 are controlled by a signal from the guard drive. The guard drive signal is communicated over an air gap in the optical isolators 470 and 490 via light pulses to maintain electrical isolation between the switch matrix and the guard drive. In addition, the guard drive signal is inverted prior to application to the input guard switch 440, the output guard switch 420, and the guard switch 455 by inverters 435, 436, and 437 respectively. In this way, the guard drive signal applies guard voltage from the input guard buffer 460 and the output guard buffer 450 across the solid state switch 410 when switching the test signal off at the input guard switch 440 and output guard switch 420.

The arrangement of network 400 allows the optical transmitters to be physically separated from the switch circuitry. In some examples, the optical transmitters may be located on physically separate circuit boards from the optical receptors and corresponding circuitry. The mechanism of operation of network 400 is as follows. The voltage sources provide constant current to optical transmitters 472, 482, and 492, which in turn provides power to operate drive circuitry through solar cells. When the solid state switch 410 switch is off, the guard drive signal is high and the switch drive signal is high. When the switch drive signal is high, the transistors in the solid state switch 410 remain off. When the guard drive signal is high, optical receptors 474 and 494 pull the gates of the transistors in the input guard switch 440 and output guard switch 420 low, which turns them off. An inversion of guard drive signal enhances the gates of input buffer switch 433 and the output buffer switch 431, thereby coupling a guard signal to the source and drain of the solid state switch 410. Because the guard input signal is nearly the same voltage as the corresponding test signal from the network input, current leakage is minimized.

To turn the network 400 on, the guard drive signal goes low. This removes light from optical transmitters 475, 485, and 495. This in turn causes optical receptor 474 and 494 to open, thereby enhancing the gates of the input guard switch 440 and the output guard switch 420. Through inversion, the same change turns off the input buffer switch 433 and the output buffer switch 431. Sometime after guard drive goes low, the switch drive goes low. This raises the voltage on the noninverting input of the solid state switch 410, which turns corresponding transistors on. As noted above, charge created by the transistors of the solid state switch 410 is channeled back to the photovoltaic cell 483, which mitigates charge injection at the solid state switch 410.

Figure 5:
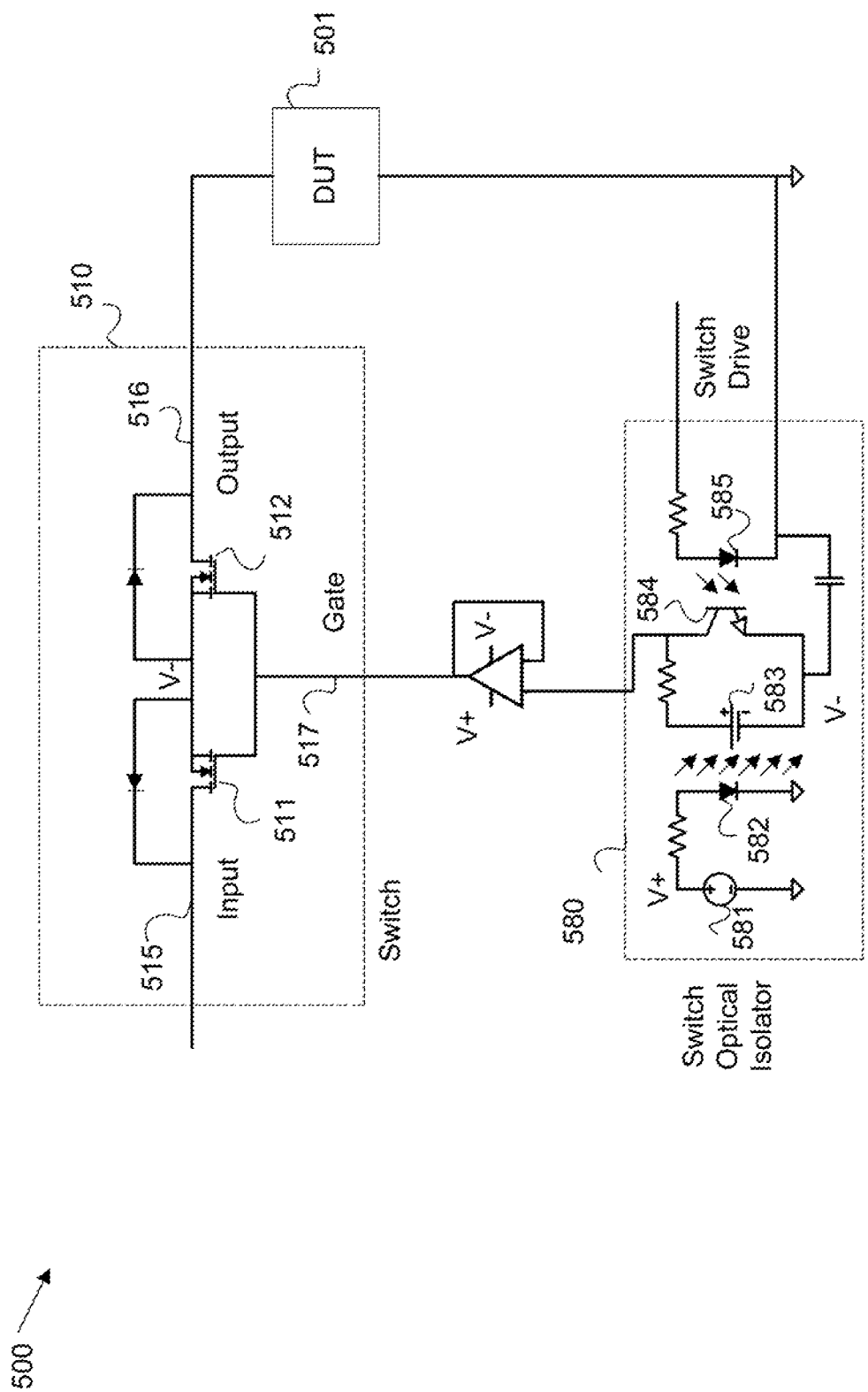
FIG. 5 is a schematic diagram of an example solid state switching network for mitigation of charge injection, in accordance with various aspects of the present disclosure.

FIG. 5 is a schematic diagram of an example solid state switching network 500 for mitigation of charge injection. Network 500 may be substantially similar to network 400 with certain components omitted for clarity of discussion. Network 500 contains a solid state switch 510 with transistors 511 and 512, an input 515, an output 516, and a gate 517, which may be substantially similar to solid state switch 200, 310, and/or 410 with transistors 211 and 212, input 215, output 216, and gate 217, respectively. The network 500 also contains a DUT 501, which may be substantially similar to DUT 101. Further, the network 500 includes a switch optical isolator 580 coupled to the gate of the solid state switch 510 and a switch drive as shown. The switch optical isolator 580 includes an optical transmitter 582 powered by a voltage source 581, a photovoltaic cell 583, an optical transmitter 585, and an optical receptor 584, which may be substantially similar to optical transmitter 482, photovoltaic cell 483, optical transmitter 485, and optical receptor 484, respectively. The mitigation of charge injection due to isolation is now explained by employing network 500.

In transistors, such as MOSFETs, the voltage change on the gate relative to source causes displacement current to flow, according to equation 1 below:

$$i = C\frac{dv}{dt} \qquad \text{Equation 1}$$

where i is the displacement current and C is the input capacitance of the transistor. Turning to transistors 511 and 512 of the solid state switch 510, the displacement current returns to the voltage source generating the voltage change on the gate 517. In FIG. 5, this net is V−. Although most of the current flows through the gate 517 to source capacitance directly to V− at the photovoltaic cell 583, some current also flows through output 516, through the DUT 501, and to ground. In non-isolated switch arrangements where the drive circuit is ground referenced, most of the displacement current flows through this pathway as charge injection into the DUT 501. This is undesirable as it can interfere with DUT 501 measurements and/or cause equipment damage.

Network 500 mitigates this issue. The optical components (e.g. photovoltaic cell 583 and/or optical receptor 584) are coupled directly to the source of transistors 511 and 512. Accordingly, most of the charge injection current is directed to the source without flowing through the DUT 501 pathway. This is because transistors 511 and 512 have a larger gate to source capacitance than gate to drain capacitance, for example by a factor of 10 or 100. Current is divided proportional to these capacitances, so most current returns to the source (e.g. at the optical components). A small portion of the current still flows through the output 516 (e.g. drain) of the solid state switch 510 toward the DUT 501. In network 500, even this current is significantly reduced because the capacitance between ground and the optical receptor 584 reference is very small due to the optical isolation, for example a fraction of one picofarad (pF). It should be noted that while network 500 depicts this problem only for solid state switch 510 transistors, the same problem exists the other transistors in the circuit (e.g. in the guard switches, buffer switches, etc.) However, the current injection issue is smaller in magnitude. As such optical isolation and capacitance reduction techniques, as shown in network 400 and/or 500 reduces or eliminates the charge injection caused by transistors during switching due to changes at the transistor gates.

It should be noted that the preceding text relates charge injection due to cycling the solid state switch 310, 410, and/or 510. There is also charge injection associated with changing the state of the input guard switches 340 and/or 440 and output guard switches 320 and/or 420. If the remote power for the guards are ground referenced to the source of each guard switch (e.g. photovoltaic cell 473, 483, and/or 493), the charge injection is mitigated. If however, a single power source is implemented for the input guard switch 440, and a second single power source for the output guard switch 420, a common mode current pathway could exist through the DUT. In this case, symmetry between the input guard and the output guard circuits eliminates this common mode current by providing a cancellation current of equal magnitude and timing.

Figure 6:
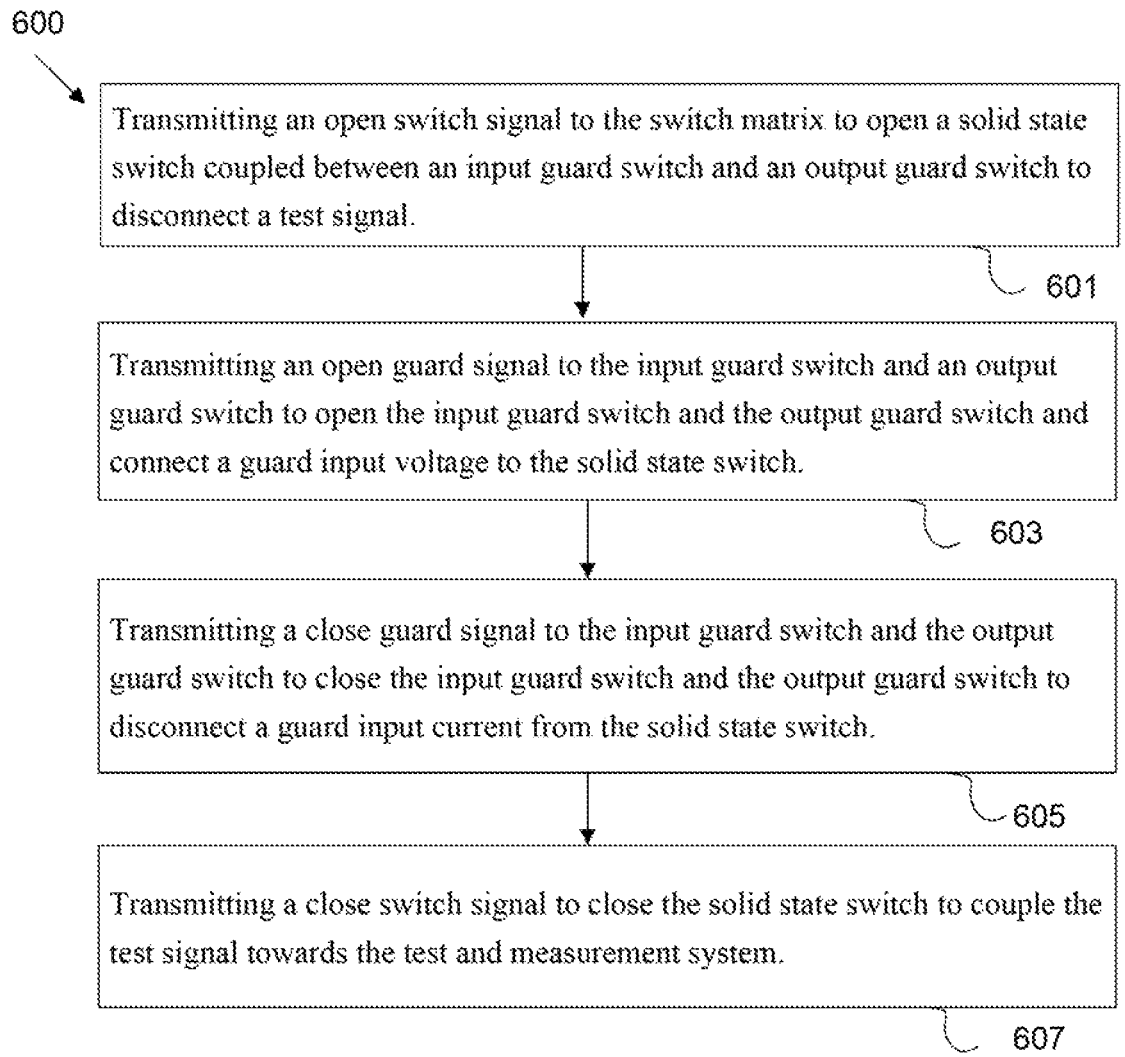
FIG. 6 is a flowchart of an example method of operating a solid state switching network, in accordance with various aspects of the present disclosure.

FIG. 6 is a flowchart of an example method 600 of operating a solid state switching network, such as networks 300, 400, and/or 500 based on a drive system as shown in network 100. Method 600 is implemented by a switch drive and/or a guard drive, such as switch drive 102 and/or guard drive 104. For purposes of clarity, the switch network is presumed to be operating in an on state and coupling a test signal prior to initiating method 600.

At block 601, an open switch signal is transmitted by a switch drive to a switch matrix. The open switch signal is forwarded to open a solid state switch coupled between an input guard switch and an output guard switch in a test and measurement switch matrix. As noted above, the solid state switch provide voltage isolation, while the input guard switch and output guard switch mitigate current leakage. The open switch signal acts to open the solid state switch and disconnect a test signal communicated from a DUT to a test and measurement system.

At block 603, an open guard signal is transmitted by a guard drive to the input guard switch and the output guard switch. The open guard signal opens the input guard switch and the output guard switch. The open guard signal causes a guard input current to be supplied to the solid state switch when the solid state switch is in an off state. For example, the guard input current is applied by switching an input buffer switch and/or an output buffer switch into a connected/on state. As noted above, the solid state switch exhibits current leakage. Accordingly, the guard input current causes the current leakage to be drawn from the guard input current instead of the test signal. Also, as noted above, the open guard signal and the open switch signal is communicated via a plurality of optical isolators via light pulses over an isolation barrier such as an air gap. This maintains electrical isolation between the test and measurement switch matrix and the guard drive and switch drive. This in turn mitigates charge injection by the test and measurement switch matrix.

Sometime later, the method 600 determines to turn the solid state switching network back into an on state in order to connect the test signal from the DUT to the test system. At block 605, the guard drive transmits a close guard signal to the input guard switch and the output guard switch. This causes the input guard switch and the output guard switch to close and couple the test signal from the DUT to the solid state switch. Further, the close guard signal disconnects the guard input current from the solid state switch. Specifically, the close guard signal removes the guard input current from the solid state switch when the solid state switch is in an on state. This is accomplished by switching an input buffer switch and/or an output buffer switch into a disconnected/off state.

At block 607, the switch drive transmits a close switch signal to close the solid state switch. This in turn couples the test signal towards the test and measurement system from the DUT. Method 600 ensures that any hot switching is accomplished by the solid state switches and not the guard switches by switching the solid state off first and on last. Further, method 600 is repeated each time a switch network in a switch matrix is toggled off and on again.

Examples of the disclosure may operate on a particularly created hardware, on firmware, digital signal processors, or on a specially programmed general purpose computer including a processor operating according to programmed instructions. The terms "controller" or "processor" as used herein are intended to include microprocessors, microcomputers, ASICs, and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable medium such as a hard disk, optical disk, removable storage media, solid state memory, RAM, etc. As will be appreciated by one of skill in the art, the functionality of the program modules may be combined or distributed as desired in various examples. In addition, the functionality may be embodied in whole or in part in firmware or hardware equivalents such as integrated circuits, field programmable gate arrays (FPGA), and the like. Particular data structures may be used to more effectively implement one or more aspects of the disclosure, and such data structures are contemplated within the scope of computer executable instructions and computer-usable data described herein.

Aspects of the present disclosure operate with various modifications and in alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific examples described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

The disclosed aspects may be implemented, in some cases, in hardware, firmware, software, or any combination thereof. The disclosed aspects may also be implemented as instructions carried by or stored on one or more or computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include Random Access Memory (RAM), Read Only Memory (ROM), Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 includes a test and measurement switch matrix comprising: a solid state switch to couple a test signal from a Device Under Test (DUT) to a test system, the solid state switch including an input (switch_in) and an output (switch out); an input guard switch coupled to the switch_in of the solid state switch, the input guard switch to apply a guard voltage to the solid state switch when the solid state switch is off; and an output guard switch coupled to the switch_out of the solid state switch to apply the guard voltage when the solid state switch is off.

Example 2 includes the test and measurement switch matrix of Example 1, further comprising an input guard buffer coupled to the input guard switch and the switch_in of the solid state switch, the input guard buffer to provide the guard voltage to the solid state switch when the solid state switch is off.

Example 3 includes the test and measurement switch matrix of any of Examples 1-2, further comprising an output guard buffer coupled to the output guard switch and the switch_out of the solid state switch, the output guard buffer to provide the guard voltage to the solid state switch when the solid state switch is off.

Example 4 includes the test and measurement switch matrix of any of Examples 1-3, wherein the input guard switch and the output guard switch exhibit lower leakage current than the solid state switch.

Example 5 includes the test and measurement switch matrix of any of Examples 1-4, wherein the solid state switch exhibits higher voltage isolation than the input guard switch and the output guard switch.

Example 6 includes the test and measurement switch matrix of any of Examples 1-5, wherein the solid state switch is a Metal Oxide Semiconductor Field Effect Transistor (MOSFET), a Bipolar Junction Transistor (BJT), an insulated-gate bipolar transistor (IGBT), or a Photoelectric Metal Oxide Semiconductor (photomos) transistor.

Example 7 includes the test and measurement switch matrix of any of Examples 1-6, further comprising a plurality of optical isolators coupled to a gate of the solid state switch, a gate of the input guard switch, and a gate of the output guard switch, the optical isolators to mitigate charge injection related to gate capacitance.

Example 8 includes the test and measurement switch matrix of Example 7, wherein the solid state switch is controlled via a switching signal from a switch drive, the switching signal communicated over an air gap in the optical isolators via light pulses to maintain electrical isolation between the test and measurement switch matrix and the switch drive.

Example 9 includes the test and measurement switch matrix of any of Examples 7-8, wherein the input guard switch, the output guard switch, an input buffer switch, and an output buffer switch are controlled by a guard signal from a guard drive, the guard signal communicated over an air gap in the optical isolators via light pulses to maintain electrical isolation between the test and measurement switch matrix and the guard drive.

Example 10 includes the test and measurement switch matrix of Example 9, wherein the guard signal switches the guard voltage across the solid state switch via the input guard buffer and the output guard buffer when switching the test signal off at the input guard switch and output guard switch.

Example 11 includes an apparatus comprising: an input guard switch including a source coupled to a switch matrix input, a drain, and a gate; an input guard switch optical isolator coupled to the gate of the input guard switch; a solid state switch including an input (switch_in) coupled to the drain of the input guard switch, an output (switch_out), and a gate; a switch optical isolator coupled to the gate of the solid state switch; an output guard switch including a source coupled to the switch_out of the solid state switch, a drain coupled to a switch matrix output, and a gate; and a output guard switch optical isolator coupled to the gate of the output guard switch.

Example 12 includes the apparatus of Example 11, further comprising: an input guard buffer with an output coupled to the switch_in of the solid state switch and the drain of the input guard switch; and an output guard buffer with an output coupled to the switch_out of the solid state switch and the source of the output guard switch.

Example 13 includes the apparatus of Example 12, further comprising: an input buffer switch to couple the output of the input guard buffer to the switch_in of the solid state switch and the drain of the input guard switch, the input buffer switch including a gate coupled to the input guard switch optical isolator; and an output buffer switch to couple the output of the output guard buffer to the switch_out of the solid state switch and the source of the output guard switch, the output buffer switch including a gate coupled to the input guard switch optical isolator.

Example 14 includes the apparatus of Example 13, further comprising: a first inverter to couple the gate of the input guard switch to the input guard switch optical isolator; and a second inverter to couple the gate of the output guard switch to the output guard switch optical isolator.

Example 15 includes the apparatus of any of Examples 13-14, wherein the input guard switch optical isolator includes: an optical transmitter coupled to a guard drive; and an optical receptor coupled to the gate of the input guard switch, the optical transmitter and the optical receptor of the input guard switch optical isolator separated by an air gap, and wherein the output guard switch optical isolator includes: an optical transmitter coupled to the guard drive; and an optical receptor coupled to the gate of the output guard switch, the optical transmitter and the optical receptor of the output guard switch optical isolator separated by an air gap.

Example 16 includes the apparatus of any of Examples 13-15, wherein the switch optical isolator includes: an optical transmitter coupled to a switch drive; and an optical receptor coupled to the gate of the solid state switch, the optical transmitter and the optical receptor of the switch optical isolator separated by an air gap.

Example 17 includes a method comprising: transmitting, by a switch drive, an open switch signal to the switch matrix to open a solid state switch coupled between an input guard switch and an output guard switch in a test and measurement switch matrix, the solid state switch to provide voltage isolation and the input guard switch and the output guard switch to mitigate current leakage, the open switch signal to disconnect a test signal from a Device Under Test (DUT) to a test and measurement system; and transmitting, by a guard drive, an open guard signal to the input guard switch and the output guard switch, the open guard signal to open the input guard switch and the output guard switch and apply a guard input voltage to the solid state switch when the solid state switch is in an off state.

Example 18 includes the method of Example 17, wherein the solid state switch includes current leakage, and the guard input voltage causes current leakage to draw from the guard input voltage instead of the test signal.

Example 19 includes the method of any of Examples 17-18, wherein the open guard signal and the open switch signal are communicated via a plurality of optical isolators via light pulses over an air gap to maintain electrical isolation between the test and measurement switch matrix and the guard drive and switch drive in order to mitigate charge injection by the test and measurement switch matrix.

Example 20 includes the method of any of Examples 17-19, further comprising: transmitting, by the guard drive, a close guard signal to the input guard switch and the output guard switch to close the input guard switch and the output guard switch, to couple the test signal from the DUT to the solid state switch, and to disconnect a guard input current from the solid state switch; and transmitting, by the switch drive, a close switch signal to close the solid state switch to couple the test signal towards the test and measurement system.

The previously described examples of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the disclosure have been illustrated and described for purposes of illustration, it will be understood that various modifications may be made without departing from the spirit and scope of the disclosure. Accordingly, the disclosure should not be limited except as by the appended claims.

We claim:

1. A test and measurement switch matrix comprising:
a solid state switch to couple a test signal from a Device Under Test (DUT) to a test system, the solid state switch including an input (switch_in) and an output (switch_out), the solid state switch structured to couple the DUT to the test system when the solid state switch is on, and to disconnect the DUT from the test system when the solid state switch is off;
an input guard switch coupled between a network input and the switch_in of the solid state switch, the input guard switch configured to disconnect the network input from the switch_in of the solid state switch when the solid state switch is off;
an input guard voltage supply to apply a guard voltage to the switch_in of the solid state switch when the solid state switch is off;
an output guard switch coupled between a network output and the switch_out of the solid state switch, the output guard switch configured disconnect the network output from the switch_out of the solid state switch when the solid state switch is off; and
an output guard voltage supply to apply the guard voltage to the switch_out of the solid state switch when the solid state switch is off.

2. The test and measurement switch matrix of claim 1, further comprising an input guard buffer coupled to the input guard switch and the switch_in of the solid state switch, the input guard buffer to provide the guard voltage to the solid state switch when the solid state switch is off.

3. The test and measurement switch matrix of claim 2, further comprising an output guard buffer coupled to the output guard switch and the switch_out of the solid state switch, the output guard buffer to provide the guard voltage to the solid state switch when the solid state switch is off.

4. The test and measurement switch matrix of claim 1, wherein the input guard switch and the output guard switch exhibit lower leakage current than the solid state switch.

5. The test and measurement switch matrix of claim 1, wherein the solid state switch exhibits higher voltage isolation than the input guard switch and the output guard switch.

6. The test and measurement switch matrix of claim 1, wherein the solid state switch is a Metal Oxide Semiconductor Field Effect Transistor (MOSFET), a Bipolar Junction Transistor (BJT), an insulated-gate bipolar transistor (IGBT), or a Photoelectric Metal Oxide Semiconductor (photomos) transistor.

7. The test and measurement switch matrix of claim 1, further comprising a plurality of optical isolators coupled to a gate of the solid state switch, a gate of the input guard switch, and a gate of the output guard switch, the optical isolators to mitigate charge injection related to gate capacitance.

8. The test and measurement switch matrix of claim 7, wherein the solid state switch is controlled via a switching signal from a switch drive, the switching signal communicated over an air gap in the optical isolators via light pulses to maintain electrical isolation between the test and measurement switch matrix and the switch drive.

9. The test and measurement switch matrix of claim 7, wherein the input guard switch, the output guard switch, an input buffer switch, and an output buffer switch are controlled by a guard signal from a guard drive, the guard signal communicated over an air gap in the optical isolators via light pulses to maintain electrical isolation between the test and measurement switch matrix and the guard drive.

10. The test and measurement switch matrix of claim 9, wherein the guard signal switches the guard voltage across the solid state switch via the input guard buffer and the output guard buffer when switching the test signal off at the input guard switch and output guard switch.

11. An apparatus comprising:
an input guard switch including a source coupled to a switch matrix input, a drain, and a gate;
a input guard switch optical isolator coupled to the gate of the input guard switch;
a solid state switch including an input (switch_in) coupled to the drain of the input guard switch, an output (switch_out), and a gate;
a switch optical isolator coupled to the gate of the solid state switch;
an output guard switch including a source coupled to the switch_out of the solid state switch, a drain coupled to a switch matrix output, and a gate; and
a output guard switch optical isolator coupled to the gate of the output guard switch.

12. The apparatus of claim 11, further comprising:
an input guard buffer with an output coupled to the switch_in of the solid state switch and the drain of the input guard switch; and
an output guard buffer with an output coupled to the switch_out of the solid state switch and the source of the output guard switch.

13. The apparatus of claim 12, further comprising:
an input buffer switch to couple the output of the input guard buffer to the switch_in of the solid state switch and the drain of the input guard switch, the input buffer switch including a gate coupled to the input guard switch optical isolator; and
an output buffer switch to couple the output of the output guard buffer to the switch_out of the solid state switch and the source of the output guard switch, the output buffer switch including a gate coupled to the input guard switch optical isolator.

14. The apparatus of claim 13, further comprising:
a first inverter to couple the gate of the input guard switch to the input guard switch optical isolator; and
a second inverter to couple the gate of the output guard switch to the output guard switch optical isolator.

15. The apparatus of claim 13, wherein the input guard switch optical isolator includes:
an optical transmitter coupled to a guard drive; and
an optical receptor coupled to the gate of the input guard switch, the optical transmitter and the optical receptor of the input guard switch optical isolator separated by an air gap, and wherein the output guard switch optical isolator includes:
an optical transmitter coupled to the guard drive; and
an optical receptor coupled to the gate of the output guard switch, the optical transmitter and the optical receptor of the output guard switch optical isolator separated by an air gap.

16. The apparatus of claim 13, wherein the switch optical isolator includes:
an optical transmitter coupled to a switch drive; and
an optical receptor coupled to the gate of the solid state switch, the optical transmitter and the optical receptor of the switch optical isolator separated by an air gap.

17. A method comprising:
transmitting, by a switch drive, an open switch signal to the switch matrix to open a solid state switch coupled between an input guard switch and an output guard switch in a test and measurement switch matrix, the solid state switch to provide voltage isolation and the input guard switch and the output guard switch to mitigate current leakage, the open switch signal to disconnect a test signal from a Device Under Test (DUT) to a test and measurement system; and
transmitting, by a guard drive, an open guard signal to the input guard switch and the output guard switch, the open guard signal to open the input guard switch and the output guard switch and apply a guard input voltage to the solid state switch when the solid state switch is in an off state.

18. The method of claim 17, wherein the solid state switch includes current leakage, and the guard input voltage causes current leakage to draw from the guard input voltage instead of the test signal.

19. The method of claim 17, wherein the open guard signal and the open switch signal are communicated via a plurality of optical isolators via light pulses over an air gap to maintain electrical isolation between the test and measurement switch matrix and the guard drive and switch drive in order to mitigate charge injection by the test and measurement switch matrix.

20. The method of claim 17, further comprising:
transmitting, by the guard drive, a close guard signal to the input guard switch and the output guard switch to close the input guard switch and the output guard switch, to couple the test signal from the DUT to the solid state switch, and to disconnect a guard input current from the solid state switch; and transmitting, by the switch drive, a close switch signal to close the solid state switch to couple the test signal towards the test and measurement system.

\* \* \* \* \*